US008170699B2

(12) United States Patent
Kressner et al.

(10) Patent No.: US 8,170,699 B2
(45) Date of Patent: May 1, 2012

(54) METERING SYSTEM AND METHOD OF OPERATION

(75) Inventors: A. Arthur Kressner, Westfield, NJ (US); Anthony F. Barna, North Massapequa, NY (US); Charles Feldman, Flushing, NY (US); Chi Yao Chen, Sunnyside, NY (US)

(73) Assignee: Consolidated Edison Company of New York, Inc., New York, NY (US)

( * ) Notice: Subject to any disclaimer, the term of this patent is extended or adjusted under 35 U.S.C. 154(b) by 0 days.

(21) Appl. No.: 12/644,991

(22) Filed: Dec. 22, 2009

(65) Prior Publication Data

US 2010/0100342 A1   Apr. 22, 2010

Related U.S. Application Data

(60) Division of application No. 12/399,465, filed on Mar. 6, 2009, which is a continuation-in-part of application No. 11/850,113, filed on Sep. 5, 2007, now Pat. No. 7,693,609.

(51) Int. Cl.
*G06F 17/00* (2006.01)
*G06F 9/32* (2006.01)
*G05B 23/02* (2006.01)
*G01R 21/00* (2006.01)
*H04H 20/71* (2008.01)

(52) U.S. Cl. ............... 700/90; 340/2.1; 340/3.1; 702/62; 455/3.01

(58) Field of Classification Search .............. 700/90; 702/62; 340/825, 2.1, 3.1; 455/3.01; 903/952; 701/22

See application file for complete search history.

(56) References Cited

U.S. PATENT DOCUMENTS

| 5,128,611 | A | * | 7/1992 | Konrad ................... 324/142 |
| 5,297,664 | A | | 3/1994 | Tseng et al. |
| 5,572,438 | A | * | 11/1996 | Ehlers et al. ............. 700/295 |
| 5,819,234 | A | | 10/1998 | Slavin et al. |
| 6,058,312 | A | | 5/2000 | Kimura |
| 6,081,205 | A | | 6/2000 | Williams |
| 6,437,692 | B1 | | 8/2002 | Petite et al. |
| 6,614,204 | B2 | | 9/2003 | Pellegrino et al. |
| 6,771,044 | B1 | | 8/2004 | Vinciguerra et al. |
| 6,900,556 | B2 | | 5/2005 | Provanzana et al. |
| 6,945,453 | B1 | | 9/2005 | Schwarz, Jr. |
| 7,013,205 | B1 | | 3/2006 | Hafner et al. |
| 7,053,767 | B2 | | 5/2006 | Petite et al. |

(Continued)

OTHER PUBLICATIONS

Fanney et al., "The Thermal Performance of Residential Electric Water Heaters Subjected to Various Off-Peak Schedules," Journal of Solar Energy Engineering, vol. 118, pp. 73-80, May 1996, 8 pages.

(Continued)

*Primary Examiner* — Sean Shechtman
(74) *Attorney, Agent, or Firm* — Kirton|McConkie; Kenneth E. Horton (57) ABSTRACT

A metering system for measuring the electrical power used to charge a vehicle is provided. The metering system includes an electrical meter operably coupled to a conductor connected to the vehicle and an electrical outlet. A controller receives signals from the meter to record the measured electrical consumption. The controller includes a plurality of communications devices for communicating with different communications carriers. In one embodiment, the controller selects one of the communications devices based on availability and a desired criterion. The selected communications device then transmits the measured electrical power consumption to a utility provider. In one embodiment, the metering system is mobile.

22 Claims, 8 Drawing Sheets

U.S. PATENT DOCUMENTS

| | | | |
|---|---|---|---|
| 7,062,361 | B1 | 6/2006 | Lane |
| 7,274,975 | B2 | 9/2007 | Miller |
| 7,373,222 | B1 | 5/2008 | Wright et al. |
| 7,402,978 | B2 | 7/2008 | Pryor |
| 7,468,661 | B2 | 12/2008 | Petite et al. |
| 7,590,472 | B2 | 9/2009 | Hakim et al. |
| 7,679,336 | B2 | 3/2010 | Gale et al. |
| 7,782,021 | B2 | 8/2010 | Kelty et al. |
| 2003/0036820 | A1 | 2/2003 | Yellepeddy et al. |
| 2003/0221883 | A1 | 12/2003 | Kubodera et al. |
| 2004/0130292 | A1 | 7/2004 | Buchanan et al. |
| 2006/0052918 | A1 | 3/2006 | McLeod et al. |
| 2006/0170409 | A1* | 8/2006 | Kagan et al. .................. 324/74 |
| 2006/0278449 | A1 | 12/2006 | Torre-Bueno |
| 2007/0271006 | A1 | 11/2007 | Golden et al. |
| 2008/0040295 | A1 | 2/2008 | Kaplan et al. |
| 2008/0052145 | A1 | 2/2008 | Kaplan et al. |
| 2008/0080703 | A1* | 4/2008 | Penning et al. .......... 379/428.02 |
| 2008/0136371 | A1 | 6/2008 | Sutardja |
| 2008/0167756 | A1 | 7/2008 | Golden et al. |
| 2008/0268838 | A1* | 10/2008 | Zufall et al. ................. 455/430 |
| 2008/0281518 | A1* | 11/2008 | Dozier et al. ................. 701/213 |
| 2008/0281663 | A1 | 11/2008 | Hakim et al. |
| 2008/0312782 | A1* | 12/2008 | Berdichevsky et al. ........ 701/22 |

OTHER PUBLICATIONS

International Search Report, International Application No. PCT/US 08/74399, mailed Oct. 31, 2008, 10 pages.

W. Kempton et al., "Vehicle-to-grid power fundamentals: Calculating capacity and net revenue", Journal of Power Sources, University of Delaware, Dec. 8, 2004, http://www.udel.edu/V2G/KempTom-V2G-Fundamentals05.PDF, retrieved Nov. 13, 2008, 12 pages.

Ol et al., "Feasibility study on hydrogen refueling infrastructure for fuel cell vehicles using the off-peak power in Japan," International Journal of Hydrogen Energy 29 (2004) 347-354, Institute of Hydrogen Energy, Jun. 2, 2003, 8 pages.

P. Denholm & W. Short, "An Evaluation of Utility System Impacts and Benefits of Optimally Dispatched Plug-In Hybrid Electric Vehicles", technical report, Oct. 2006, 30 pages, National Renewable Energy Laboratory, U.S. Department of Energy Office of Energy Efficiency & Renewable Energy, Golden, CO, US.

W. Kempton et al., "Vehicle-to-Grid Power: Battery, Hybrid, and Fuel Cell Vehicles as Resources for Distributed Electric Power in California", Report prepared for the California Air Resources Board and the California Environmental Protection Agency and the Los Angeles Department of Water and Power, Electric Transportation Program, Jun. 2001, http://www.udel.edu/V2G/docs/V2G-Cal-2001.pdf, retrieved Nov. 13, 2008, 94 pages.

International Preliminary Report on Patentability for International Patent Application PCT/US2008/074399, mailed Mar. 18, 2010, 8 pages.

U.S. Appl. No. 12/568,101, filed Sep. 28, 2009, Named Inventor: A. Arthur Kressner.

U.S. Appl. No. 12/568,140, filed Sep. 28, 2009, Named Inventor: A. Arthur Kressner.

U.S. Appl. No. 12/569,390, filed Sep. 29, 2009, Named Inventor: A. Arthur Kressner.

U.S. Appl. No. 12/399,465, filed Mar. 6, 2009, Named Inventor: A. Arthur Kressner (now Patent No. 7,917,251).

U.S. Appl. No. 12/569,348, filed Sep. 29, 2009, Named Inventor: A. Arthur Kressner (now Patent No. 7,792,613).

U.S. Appl. No. 11/850,113, filed Sep. 5, 2007, Named Inventor: A. Arthur Kressner (now Patent No. 7,693,609).

U.S. Appl. No. 12/815,699, filed Jun. 15, 2010, Named Inventor: A. Arthur Kressner.

U.S. Appl. No. 13/032,430, filed Feb. 22, 2011, Named Inventor: A. Arthur Kressner.

* cited by examiner

METERING SYSTEM AND METHOD OF OPERATION

CROSS REFERENCE TO RELATED APPLICATIONS

This application is a Divisional application of the U.S. patent application entitled "METERING SYSTEM AND METHOD OF OPERATION" having Ser. No. 12/399,465 filed on Mar. 6, 2009 which is a Continuation-In-Part of U.S. patent application entitled "HYBRID VEHICLE RECHARGING SYSTEM AND METHOD OF OPERATION" having Ser. No. 11/850,113 filed on Sep. 5, 2007, both of which are incorporated by reference in their entirety.

BACKGROUND OF THE INVENTION

The present invention relates generally to a system for utility metering electrical usage by plug-in electric vehicles during recharging and more particularly to a mobile system for plug-in electric vehicles that allows utility metering of electricity independent of location.

Due to rising cost of petroleum and the fuels derived from it, the desire to improve efficiency to reduce air pollutants and increasingly more restrictive regulatory requirements, the automotive industry has developed new types of vehicles that utilize a combination of power sources to provide the necessary energy for the propulsion of vehicles. Rather than rely solely on an internal combustion engine, these new vehicles, referred to as hybrid vehicles, utilize an internal combustion engine in combination with an electric motor. Another version called a plug-in electric vehicle may also supplement the charging of the batteries from the electric grid or other sources. Depending on the mode of operation, the vehicle will use the combustion engine, the electric motor, or a combination thereof. By using the electric motor at various times, the combustion engine could be shut off, reducing the amount of gasoline or other fuel consumed using electricity to power the motor instead. The electric motor is powered by batteries that are periodically recharged through a combination of a generator coupled to the combustion engine, regenerative breaking technology and from the local utility grid or other external source of electricity. Regenerative breaking allows the capture of energy that would otherwise be dissipated through heat when the vehicle is slowed down or brought to a stop.

Plug-in electric vehicles provided many advantages over internal combustion engine vehicles and previous generations of all-electric vehicles. The plug-in electric vehicle provides greater range and more flexibility for the operator. Since the all-electric vehicle needed to be charged periodically, and required several hours at a minimum to recharge, the operator needed to remain aware of the level of charge remaining in the batteries to ensure they were able to return to their charging station. Plug-in electric vehicles, in contrast, by having two different sources of propulsion do not carry the same risks due to the wide availability of fuels such as gasoline.

A typical plug-in electric vehicle uses a nickel metal hydride battery or the like to store electrical charge. When run in pure electric mode, the plug-in electric vehicle can only operate for short distances, 2 km-32 km for example, before requiring the use of the gasoline engine. Since the gasoline engine recharges the batteries, at least in part, the vehicle manufacturers need to balance the amount of battery storage against fuel efficiency to provide a vehicle that meets the consumer's performance expectations.

The plug-in electric vehicles include a receptacle that connects the batteries to a standard 110V or 220V household electrical outlet and allows the consumer to recharge the batteries using utility electric power rather than by burning gasoline or other fuel in a combustion engine. This allows the plug-in electric vehicles to have a longer range in electric mode of operation since larger capacity batteries may be used, resulting in vehicle that uses less gasoline and thus lower emissions.

Incentives, such as lower electrical tariff rates for example, exist to encourage greater usage of utility electrical power over gasoline combustion. However, it is difficult to provide these benefits to the operator when the vehicle is charged away from their home or place of business since the operator's meter and utility account is associated with a physical location.

Thus, while existing metering systems are suitable for their intended purpose, there remains a need for improvements, particularly regarding the metering of plug-in electric vehicles and the interfacing with a utility.

BRIEF DESCRIPTION OF THE INVENTION

According to one aspect of the invention, an electrical metering device is provided. The metering device includes an electrical power input. An electrical power output is electrically coupled to the input, the output being adapted to operably couple with a vehicle. A meter is operably coupled between the input and the output. A controller is electrically coupled to the meter. A first communications device is electrically coupled to the controller, such that the first communications device is adapted to transmit data using a first wireless carrier. A memory device is electrically coupled to the meter. The controller also includes a processor responsive to executable computer instructions for storing data indicative of electrical power consumption by the vehicle in the memory device in response to a first signal from the meter.

According to another aspect of the invention, a mobile metering device for vehicles is provided. The mobile metering device includes a current transformer. A meter electrically coupled to the current transformer. A controller having a memory device is electrically coupled to the meter. A plurality of communications devices is electrically coupled to the controller.

According to yet another aspect of the invention, a method of charging a vehicle having batteries is provided. The method includes the step of coupling a meter between the vehicle and an electrical outlet. An amount of electrical power provided to the vehicle is measured. Data indicative of the measured amount of electrical power is stored. An availability of a first wireless communications carrier is determined. The stored data is transmitted on the first wireless communications carrier.

These and other advantages and features will become more apparent from the following description taken in conjunction with the drawings.

BRIEF DESCRIPTION OF THE DRAWING

The subject matter, which is regarded as the invention, is particularly pointed out and distinctly claimed in the claims at the conclusion of the specification. The foregoing and other features, and advantages of the invention, are apparent from the following detailed description taken in conjunction with the accompanying drawings. Referring now to the drawings, which are meant to be exemplary and not limiting, and wherein like elements are numbered alike:

The detailed description explains embodiments of the invention, together with advantages and features, by way of example with reference to the drawings.

DETAILED DESCRIPTION OF THE INVENTION

Figure 1:
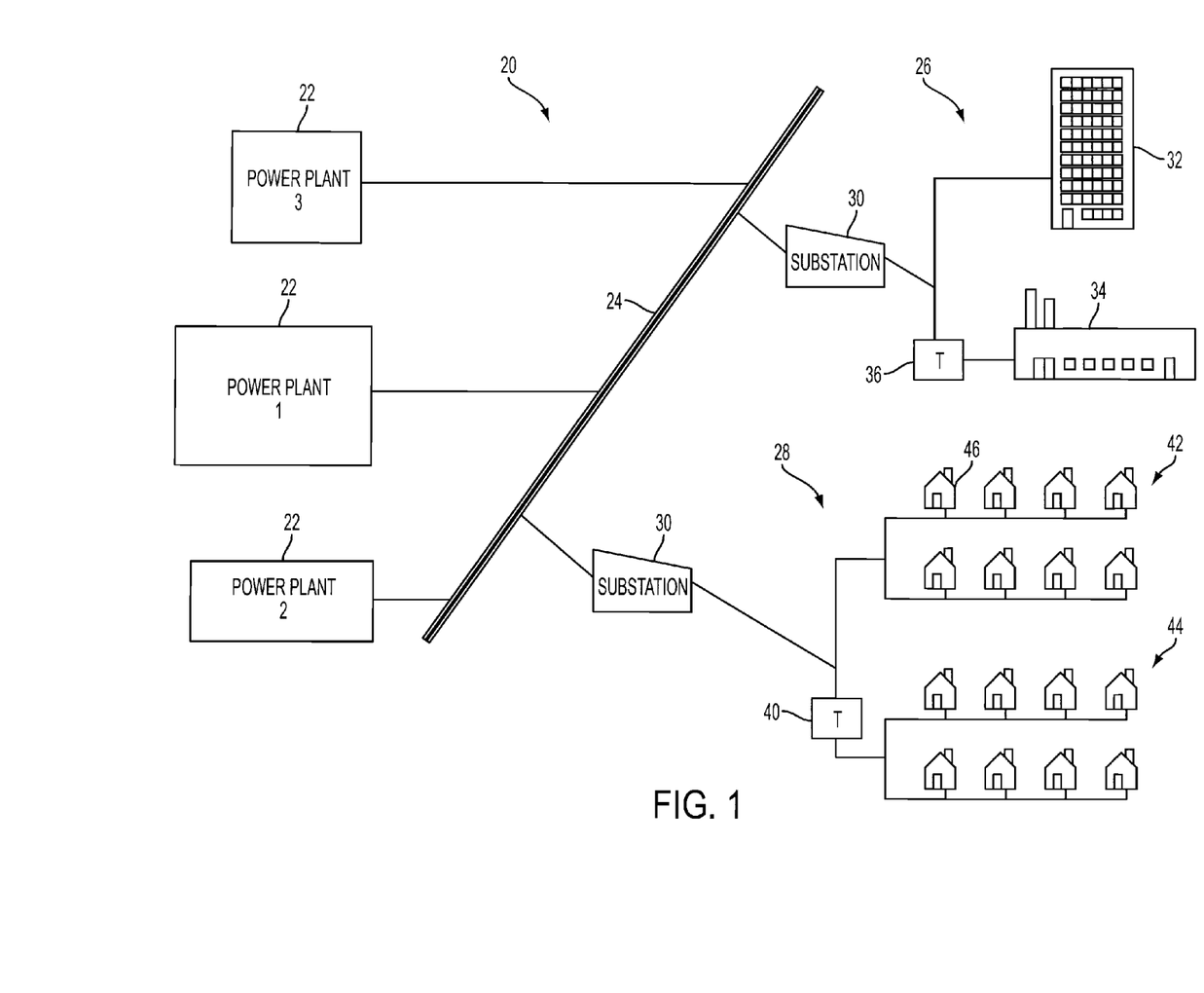
FIG. 1 is a schematic illustration of a utility electrical distribution system.

FIG. 1 illustrates an exemplary embodiment of a utility electrical distribution network 20. The utility network 20 includes one or more power plants 22 connected in parallel to a main distribution network 24. The power plants 22 may include, but are not limited to: coal, nuclear, natural gas, or incineration power plants. Additionally, the power plants 22 may include one or more hydroelectric, solar, or wind turbine power plants. It should be appreciated that additional components such as transformers, switchgear, fuses and the like (not shown) may be incorporated into the utility network 22, as needed, to ensure the safe and efficient operation of the system. The utility network 20 may be interconnected with one or more other utility networks to allow the transfer of electrical power into or out of the electrical network 20.

The main distribution network 24 typically consists of medium voltage power lines, less than 50 kV for example, and associated distribution equipment which carry the electrical power from the point of production at the power plants 22 to the end users located on local electrical distribution networks 26, 28. The local distribution networks 26, 28 are connected to the main distribution network by substations 30 which adapt the electrical characteristics of the electrical power to those needed by the end users. Substations 30 typically contain one or more transformers, switching, protection and control equipment. Larger substations may also include circuit breakers to interrupt faults, such as short circuits or over-load currents for example. Substations 30 may also include equipment such as fuses, protective relays, surge protection, controls, meters, capacitors and voltage regulators.

The substations 30 connect to one or more local electrical distribution networks, such as local distribution network 26 for example, that provides electrical power to a commercial area having end users such as an office building 32 or a manufacturing facility 34. Local distribution network 26 may also include one or more transformers 36 which further adapt the electrical characteristics of the delivered electricity to the needs of the end users. Substation 30 may also connect with other types of local distribution networks such as residential distribution network 28. The residential distribution network 28 may include one or more residential buildings 46 and also light industrial or commercial operations.

The electrical power available to an end user on one of the local distribution networks 26, 28 will depend on the characteristics of local distribution network and where on the local network the end user is located. For example, local distribution network 28 may include one or more transformers 40 that further divide local distribution network 28 into two sub-networks 42, 44. One such electrical characteristic is the maximum power that may be delivered to a local distribution network. While the utility network 20 may have power plants 22 capable of generating many megawatts of electrical power, this power may not be completely available to an end user in a residential building 46 on a local distribution network 28 since the intervening equipment and cabling restricts, or limits the delivery of electrical power.

Figure 2:
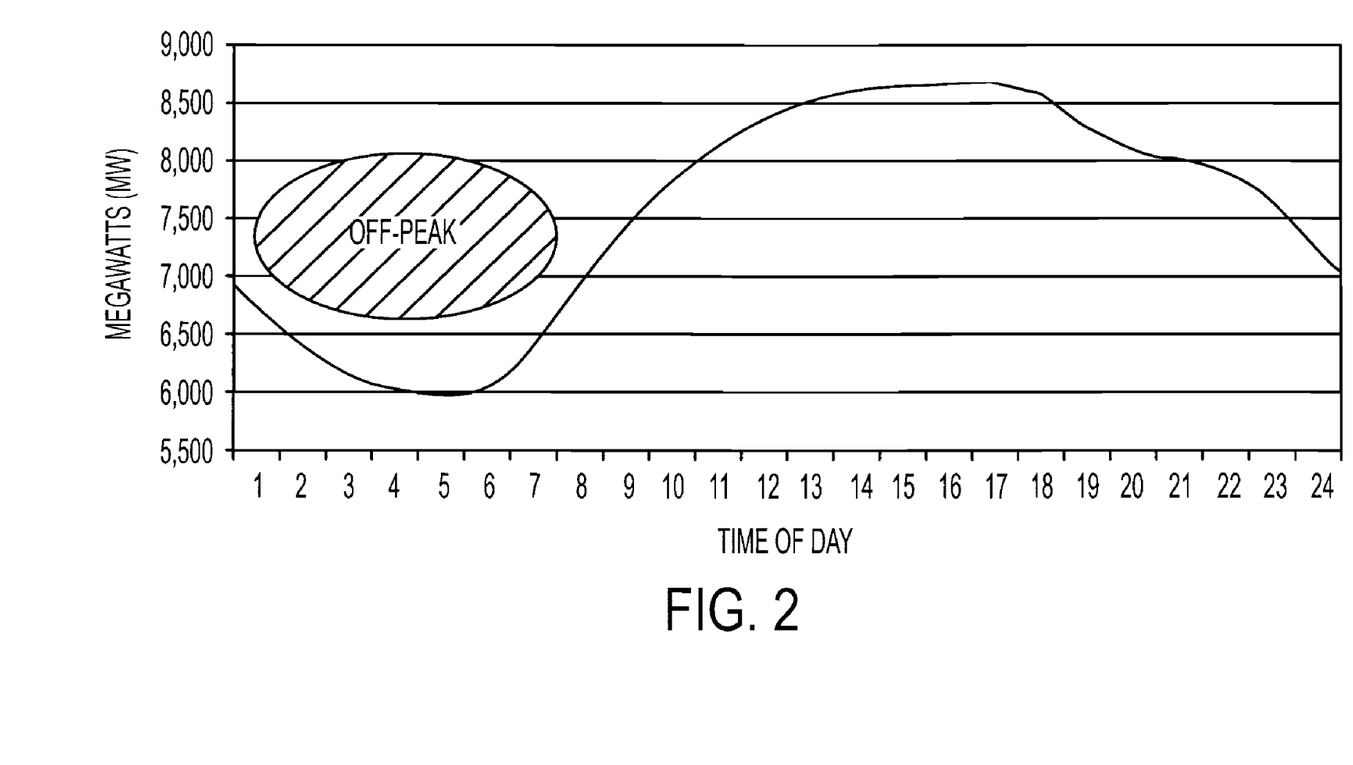
FIG. 2 is an illustration of an average electrical demand profile for electrical usage of a large metropolitan city having the electrical distribution network of FIG. 1.

Existing local distribution networks 26, 28 are designed to provide the electrical power demanded during peak usage periods. Referring to FIG. 2, it can be seen that the demand for electrical power does not remain constant during the day, but rather peaks in the late afternoon/early evening. The demand curve illustrated in FIG. 2 is an average electrical demand for a large metropolitan city. The actual demands on the local distribution network will change from one day to the next and will also differ depending on the season. The actual demand will be the function of many parameters, including the weather, time of day, season of the year and the like. Further if a local distribution network 26, 28 experiences an increase in electrical demand due to other factors, such as new construction for example, changes may need to be made to the local distribution network to allow sufficient power to flow to the local distribution network, even though the utility network 20 has sufficient electrical production capacity to meet the needs of the new demand.

Plug-in electric vehicles represent one such type of increase in electrical power demand on the utility network 20. It has been estimated that the existing utility networks have sufficient generation capacity such that plug-in electric vehicles would need to achieve a market penetration of 30%-40% before additional capacity would need to be added. However, a lower market penetration as well as the higher market penetrations may result in power constraints on individual local distribution networks depending on a number of factors including the local distribution network power delivery capacity, the existing base load and the number of plug-in electric vehicles on the local distribution network. The power constraints on a local distribution network, such as residential network 28 for example, may be further complicated by the demographics of the network. In a residential network, the owners of plug-in electric vehicles will be tend to arrive home from work in the late afternoon or early evening. When the owners arrive home, they will tend to connect their plug-in electric vehicle to an electrical outlet during the same time frame. Without some type of control, the additional electrical demands from many plug-in electric vehicles could be placed on the local distribution network at the time of day also corresponds to the peak demand period.

Different incentives have been proposed to encourage customers to shift recharging of their vehicles to off peak time periods. These proposals, which include reduced off-peak electrical tariff rates for the vehicle and prepaid accounts for example, may need the electrical power consumption for the vehicle to be separately metered from the customers physical location account (e.g. residential building 46).

Figure 3:
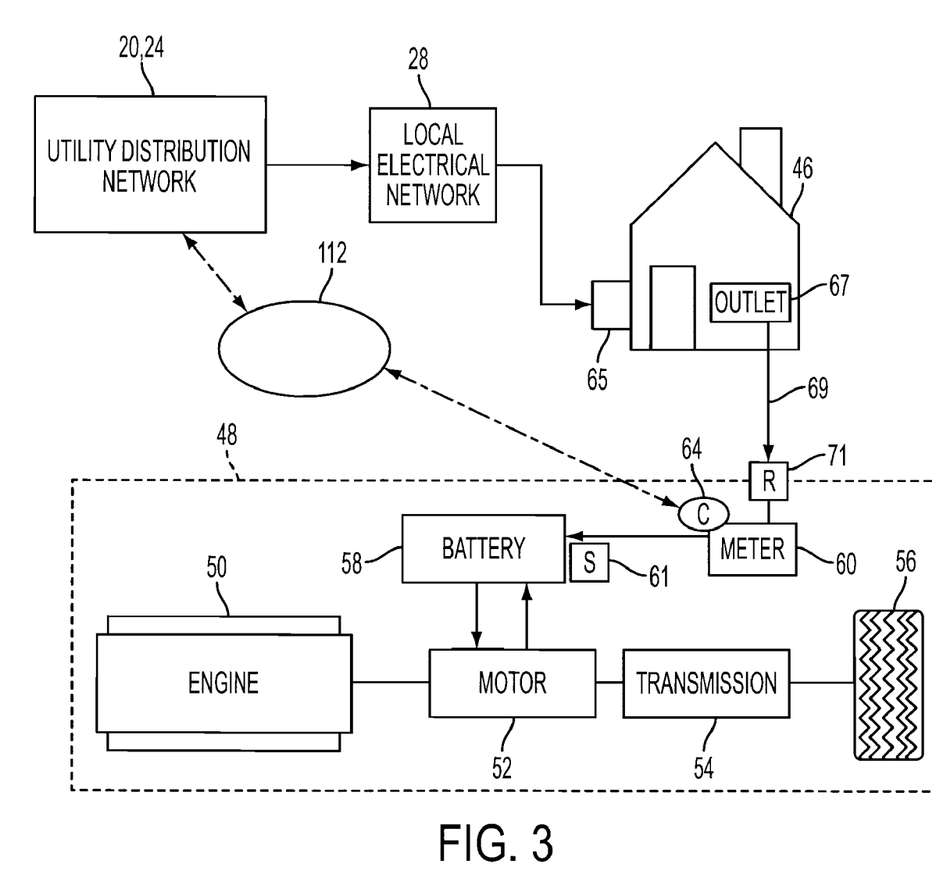
FIG. 3 is a schematic illustration of a plug-in electric vehicle charging system in accordance with an embodiment.

Referring now to FIG. 3, an exemplary embodiment of a system for metering the charging of a plug-in electric vehicle will be described. A plug-in electric vehicle 48 typically includes an internal combustion engine 50 coupled to a motor 52 through a transmission 54 that transfers the power from the engine 50 and motor 52 to the wheels 56. A battery 58 is electrically coupled to provide electricity to power the motor 52. Alternatively, the motor 52 may be arranged to act as a generator driven by the engine 50 to provide recharging of the battery 58. It should be appreciated that the battery 58 is referred to as a single component, however, the battery 58 may be comprised of a number of electrochemical cells or discrete individual batteries that are coupled together in series or parallel, depending on the voltage and power needs. The battery 58 is electrically coupled, such as through an inverter (not shown) for example, to the monitoring device 60, which provides an external connection to a power source. A monitoring device 60 is electrically connected between the connector 71 and the battery 58 to measure the flow of electrical power to the battery 58. A sensor 61 coupled to the plug-in electric vehicle to measure the charge remaining in the battery 58. As will be discussed in more detail herein, it should be appreciated that the sensor 61 may be accessible to the monitoring device 60 via the plug-in electric vehicle's 48 on-board diagnostic system (e.g. OBD II).

A cable 69 couples the connector 71 to an outlet 67 in residence 46. The cable 69 is appropriately sized to support the flow of electrical power between the plug-in electric vehicle 48 and the residence 46. In the exemplary embodiment, the residential household circuit the cable will support 1.5 kilowatts at 110 volts up to 10.0 kilowatts at 240 volts. It should be appreciated that in commercial facilities, additional electrical power may be available and at higher voltages. The outlet 67 is connected to a residential meter 65 that connects the residence 46 to the local distribution network 28. The residential meter 65 measures the amount of electrical power supplied from the local distribution network 28 to the residence 46.

It should be appreciated that while the embodiment illustrated in FIG. 3 shows the monitoring device 60, the communications device 64 and the connector 71 as being positioned within the vehicle 48, this is for exemplary purposes and not intended to be limiting. The monitoring device 60, the communications device 64 and the connector 71 may also be positioned outside the vehicle, such as in a stand-alone housing, mounted to the wall of a garage, mounted to a utility pole or the like for example.

Figure 4:
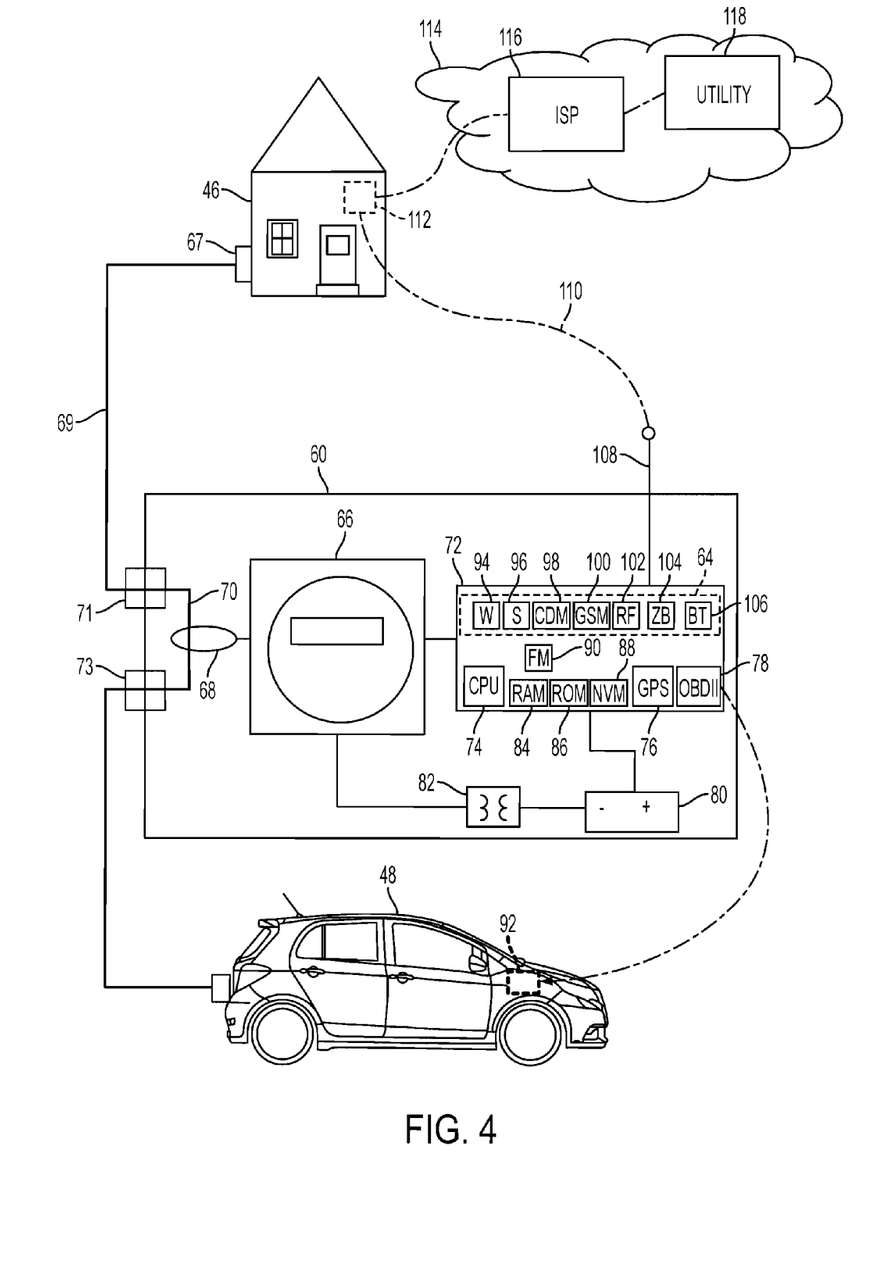
FIG. 4 is a schematic illustration of an exemplary metering system for use with the plug-in electric vehicle of FIG. 3.

Referring now to FIG. 4, the monitoring device 60 is shown. The monitoring device 60 includes a utility-grade electrical metering device 66 that is coupled to a sensor, such as current transformer 68 for example, to monitor the flow of electrical power through a cable 70. A pair of connectors 71, 73 are arranged on either end of the cable 70 to provide an interface with the plug-in electric vehicle 48 and the residence power outlet 67. It should be appreciated that the monitoring device 60 may be coupled in between the power source (e.g. outlet 67) and the plug-in electric vehicle 48 in a number of different configurations, such as the elimination of connectors 71, 73 and the routing of a single cable 70 between the outlet 67 and the plug-in electric vehicle 48 for example, without deviating from the intended scope of the claimed invention. In the exemplary embodiment, the connectors 71, 73 are standard electrical outlet plugs, such as NEMA 5-15/Canadian standard CS22.2, n° 42 for example. In other embodiments, larger outlet plugs or OEM specific outlet plugs may be used.

The meter 66 is connected transmit and receive signals from a controller 72. In the exemplary embodiment, the controller 72 includes a processor 74, and a communications device 64. The controller 72 may also include additional circuits such as a global positioning satellite (GPS) device 76 and an interface 78 for an on-board diagnostic system 92 in plug-in electric vehicle 48. In the exemplary embodiment, the interface 78 complies with the ODB-II communications protocol for transmitting and receiving signals from the plug-in electric vehicle 48. The monitoring device 60 may also include a battery 80 and power electronics 82 connected between the meter 66 and the controller 72 to provide electrical power needed for the operation of the controller 72.

The controller 72 may be embodied in the form of computer-implemented processes and apparatuses for practicing those processes. The controller 72 may also be embodied in the form of a computer program product having computer program code containing instructions embodied in tangible media, such as floppy diskettes, CD-ROMs, hard drives, USB (universal serial bus) drives, flash memory 90 or any other computer readable storage medium, such as random access memory 84 (RAM), read only memory 86 (ROM), or erasable programmable read only memory 88 (EPROM), for example, wherein, when the computer program code is loaded into and executed by a computer, the computer becomes part of the monitoring device 60. The controller 72 may also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein when the computer program code is loaded into and executed by a computer, the computer becomes part of the controller 72. When implemented on a general-purpose microprocessor, the computer program code segments configure the microprocessor to create specific logic circuits. As will be described in more detail below, one example of a technical effect of the executable instructions is to determine the amount of electrical power provided to the plug-in electric vehicle 48 for charging the battery 58 and to communicate a signal indicative of the measured electrical power using an available communications carrier.

The communications device 64 provides a means for the controller 72 to communicate signals embodying information on multiple communications carriers as will be described in more detail herein. The communications device 64 may incorporate any type of communications protocol capable of allowing the controller 72 to receive, transmit and exchange information with one or more external devices. In the exemplary embodiment, the communications device 64 includes multiple communications circuits or devices that allow for communications over different wireless carriers depending on their availability. This provides the advantage of increasing the robustness and reliability of the monitoring device's 60 ability to communicate data on electrical usage. Communications device 64 may use wireless communication systems, methodologies and protocols such as, but is not limited to, IEEE 802.11, IrDA, infrared, radio frequency, electromagnetic radiation, microwave, Bluetooth, and laser. Further, communications device 64 may include one or more wired communications systems, methodologies and protocols such as but not limited to: TCP/IP, RS-232, RS-485, Modbus, power-line, telephone, local area networks, wide area networks, Ethernet, cellular, and fiber-optics.

In the exemplary embodiment, the communications device 64 includes a plurality of communications circuits or devices, such as IEEE 802.11 device 94 commonly referred to as Wifi, a satellite device 96, a CDMA compliant cellular device 98, a GSM compliant cellular device 100, a radio frequency device 102, a IEEE 802.15.4 device 104 commonly referred to as Zigbee, and a Bluetooth compliant device 106. In one embodiment, the satellite device 96 transmits data on a frequency range of 3 to 40 gigahertz. In another embodiment, the radio frequency device 102 transmits on a frequency range of 30 kilohertz to 3000 megahertz. The controller 72 may further include an optional antenna 108 to assist in the transmission to the communication medium or carrier 110.

The controller 72 may be any suitable control device capable of receiving multiple inputs and providing control functionality to multiple devices based on the inputs. Controller 72 includes the processor 74 that is a suitable electronic device capable of accepting data and instructions, executing the instructions to process the data, and presenting the results. Processor may accept instructions through a user interface, or through other means such as but not limited to electronic data card, voice activation means, manually operable selection and control means, radiated wavelength and electronic or electrical transfer. Therefore, the processor can be a microprocessor, microcomputer, a minicomputer, an optical computer, a board computer, a complex instruction set computer, an ASIC (application specific integrated circuit), a reduced instruction set computer, an analog computer, a digital computer, a molecular computer, a quantum computer, a cellular computer, a superconducting computer, a supercomputer, a solid-state computer, a single-board computer, a buffered computer, a computer network, a desktop computer, a laptop computer, or a hybrid of any of the foregoing.

The monitoring device 60 is disposed in communication with an intermediary device 112 to exchange data via communication carrier 110. The intermediary device 112 may be a wireless router 112 for example, such as when the plug-in electric vehicle 48 is located at the customer's residence 46. In other embodiments, the intermediate device 112 may be utility meter arranged to communicate with the utility 118, such as through power line, telecommunications or wireless mediums for example. The wireless router 112 allows the controller 72 to connect through a network 114 to a service provider 116, such as an internet service provider for example, and to the utility 118. This allows the measured electrical power usage for the plug-in electric vehicle 48 to be transmitted to the utility company 118. As will be described in more detail below, the controller 72 includes further functionality to determine which of the communications devices 94, 96, 98, 100, 102, 104, 106 have communications service available. The controller 72 may then select which communications carrier to use. For example, the communications carrier may be based on cost, with the lower cost communication carrier being utilized before a higher cost service for example. In the exemplary embodiment, the controller 72 is described as being single computer processing device, however, it is contemplated that the controller 72 may also be a distributed or networked computing system comprised of a number of processing components.

It should be appreciated that as used herein, the term "utility" may refer to an entity such as a public utility, or to any other entity, or service provider that delivers or tracks the delivery of electrical power to the vehicle 48. For example, the utility 118 may also be a corporation having a fleet of vehicles 48. The corporation may desire to track electrical consumption for the purposes of achieving improved rates as discussed above, or for obtaining carbon credits as will be discussed in more detail below.

It should be appreciated that the utility 118 may obtain information about the location of the plug-in electric vehicle 48. The location information may be determined in a number of ways. For example, the GPS device 76 may record the coordinates of the plug-in electric vehicle 48 and the controller 72 may transmit the location data with the electrical power usage data. Alternatively, the location information may be derived from the intermediary device 112 that the controller 72 connects to, for example, in the embodiment where the controller 72 communicates through a wireless router 112, the internet protocol (IP) address for the router 112 may provide a location to the utility.

One issue with metering a vehicle, which is not fixed to a physical location, is that the vehicle may be charged in multiple locations. For example, the operator may use the vehicle on a vacation, or the operator may desire to recharge the battery 58 during the day when they are at work. The ability to charge the battery 58 at different locations may provide advantages for both the operator/customer and the utility. By providing charging stations, such as at locations of major employers or in metropolitan centers for example, the electrical power may be delivered in locations where the utility infrastructure is better equipped to handle the load. Similarly, the customer may have an opportunity to lower costs by charging at a known tariff rate. As a result, the monitoring device 60 needs to be able to reliably communicate with the utility 118 from a variety of locations.

Figure 5:
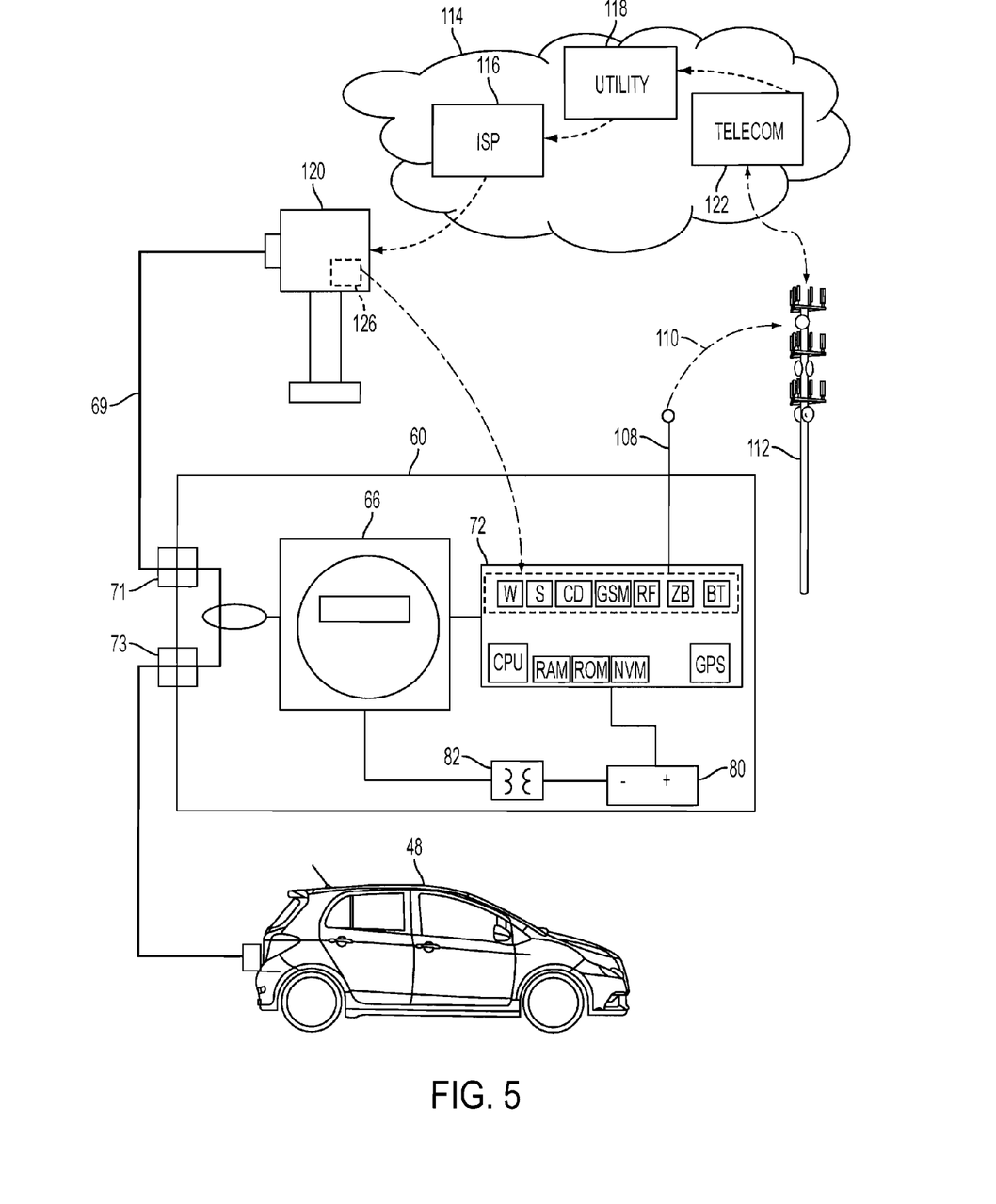
FIG. 5 is another schematic illustration of the exemplary metering system for the plug-in electric vehicle of FIG. 3.

In the embodiment shown in FIG. 5, the plug-in electric vehicle 48 is located away from the physical location associated with the utility account, such as residence 46 for example. The plug-in electric vehicle 48 is coupled to a charging station 120. The charging station 120 may be located at the operator's place of work, or may be in a parking/charging lot close to where they work for example. The monitoring device 60 is connected to the charging station 120 by a power cable 69. As described above, the meter 66 measures the amount of electrical power flowing to the plug-in electric vehicle 48. The controller 72, with the processor 74 stores the data in either nonvolatile memory 88, or flash memory 90, to record the amount of electrical power measured by meter 66.

When the battery 58 has been recharged, the controller 72 queries the communications devices 94, 96, 98, 100, 102, 104, 106 to determine what communications carriers are available to transmit data. Since the operator is away from their residence 46, the IEEE 802.11 (Wifi) communications device 94 may not be able to transmit the data. If this is the case, the controller 72 then determines which of the other communications devices would be the most cost effective to transmit the electrical meter data. This determination may be performed automatically, such as from a prioritization order stored in memory, or the controller 72 may negotiate a rate with the available communications carriers. In either case, the most cost effective communications carrier is selected and the data is transmitted and received by the utility 118. The data may include either or both usage information or permission data allowing the charging of the battery 58.

In the embodiment illustrated in FIG. 5, the intermediate communications device 112 is a cellular antenna 112. As such, the controller 72 uses one of the cellular communications devices, such as CDMA compliant device 98 or GSM compliant device 100 for example. The data is transmitted to the cellular antenna 112, which transfers the information through the telecommunications provider 122 into the network 114 and to the utility 118.

In some embodiments, the charging station 120 may need to authenticate the plug-in electric vehicle prior to allowing the charging process to begin. In this embodiment, the charging station 120 may have a transponder 126. Upon the connecting of the cable 69 to the charging station 120, the transponder 126 sends a signal to the plug-in electric vehicle 48. The transponder signal may be transmitted using a number of methods, such as via IEEE 802.11 (Wifi) device 94, Bluetooth device 106 or using powerline communications through the cable 69 for example. Once the transponder signal is received by the controller 72, the controller 72 uses one of the communications devices 94, 96, 98, 100, 102, 104, 106 to contact the utility 118, such as through the cellular antenna 112 as described above. The data transmitted to the utility 118 may include such information as the location of the plug-in electric vehicle 48, the identification number of the charging station 120, the identification data for the vehicle or meter, and the like.

Upon receiving the signal from the plug-in electric vehicle 48, the utility 118 may issue an authorization code to allow the plug-in electric vehicle 48 to be charged. The authorization code may be transmitted back through the network 114 to the plug-in electric vehicle 48, or alternatively, the signal may be sent to the charging system 120 such as through an internet service provider 116 for example.

Figure 7:
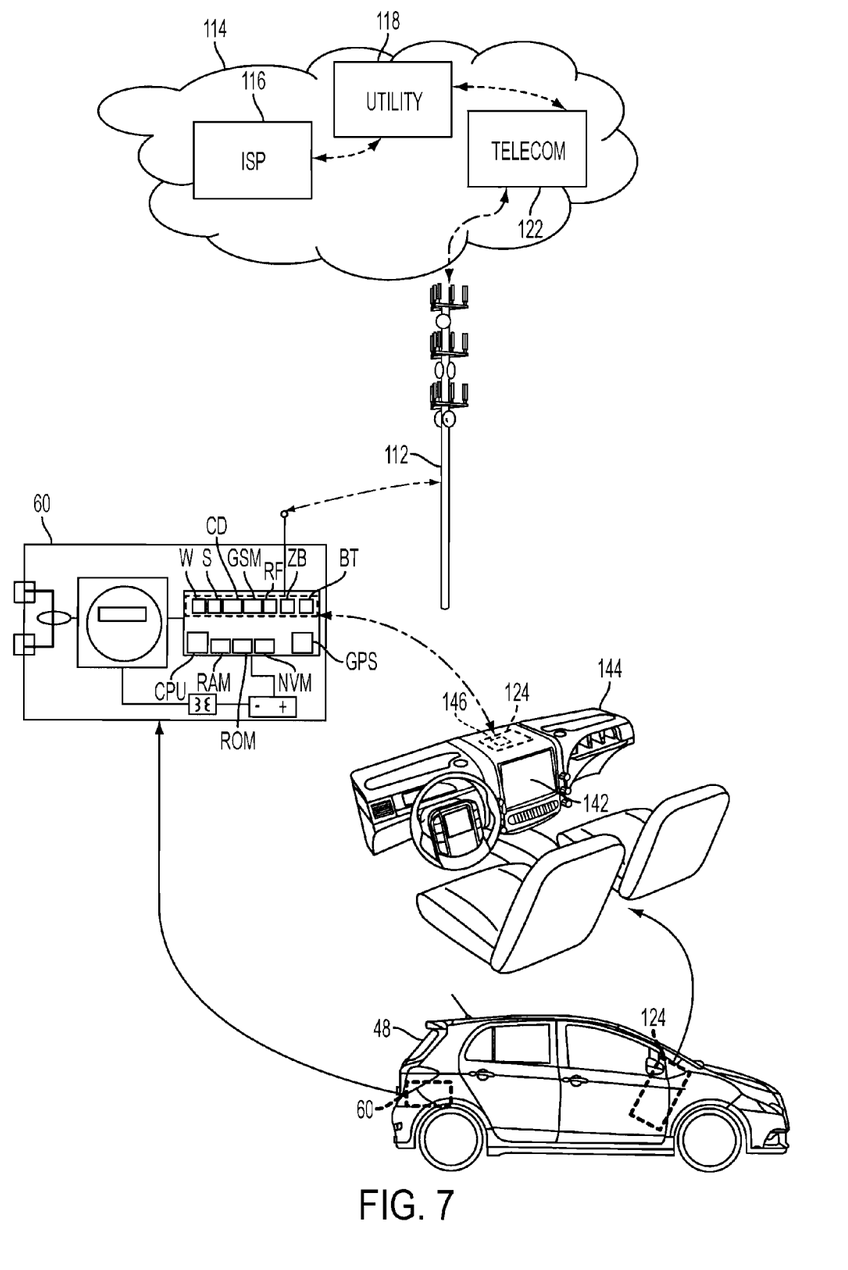
FIG. 7 is a schematic illustration of a vehicle communications system for the plug-in electric vehicle of FIG. 3; and, FIG. 8 is flow chart illustration of a method of metering and communicating electrical power consumption by a vehicle.

In another embodiment, the utility transmits an authorization code that is displayed on an in-vehicle computer system 124 (FIG. 7). The operator may then enter the authorization code into the charging system 120 to initiate charging. Alternatively, the authorization code may be transmitted by the utility 118 to the operators cell phone, such as through SMS messaging for example.

In some embodiments, the authentication for charging may not require communication with the utility 118. For example, the transponder signal may include identification data that the charging station recognizes as being acceptable for charging. The identification data may be in the form of a radio frequency identification device ("RFID") or a media access control ("MAC") address. In one embodiment, the cable 69 includes a circuit having a MAC address that communicates with the charging station to provide authorization.

It should be appreciated that while the intermediary device 112 has been described in reference to a wireless router and a cellular tower, other intermediary devices may be used. For example, the intermediary device may be, but is not limited to: a satellite, a paging system, a radio antenna, or a microwave antenna for example. The intermediate device 112 may also be an electrical meter associated with the charging station or the operators home or facility.

Figure 6:
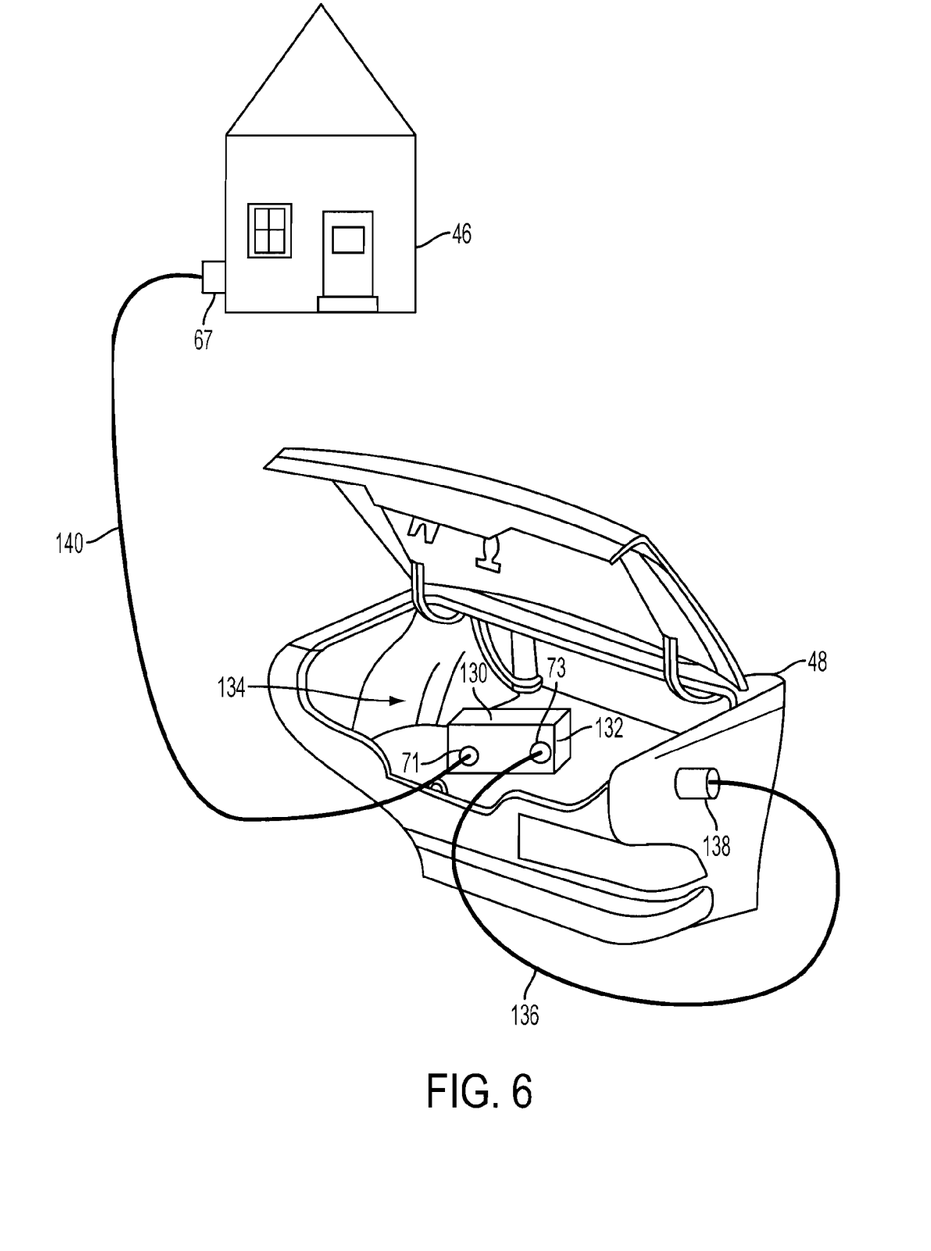
FIG. 6 is a schematic illustration of an alternate embodiment metering system for the plug-in electric vehicle of FIG. 3.

Referring now to FIG. 6 a mobile monitoring device 130 is illustrated. The monitoring device 130 includes a housing 132 containing the meter 66, current transformer 68, controller 72, battery 80 and power electronics 82 as described herein above. In this embodiment, the monitoring device 130 is sized to fit in a trunk 134 or the rear area of the plug-in electric vehicle 48. It is desirable for the mobile monitoring device 130 to be transported by a single person. In the exemplary embodiment, the mobile metering device 130 weighs less than 50 lbs.

A first electrical cable 136 couples to the connector 73 to connect the monitoring device 130 to a port 138 on the plug-in electric vehicle 48. Similarly, a second electrical cable 140 connects the connector 71 to the outlet 67 such as in at the residence 46 for example. It should be appreciated that the embodiment illustrated in FIG. 6 provides a number of advantages. Where the manufacturer does not configure the plug-in electric vehicle with separate metering, the monitoring device 130 allows the customer and the utility to provide the functionality with no modification of the plug-in electric vehicle 48. Further, if the customer has multiple vehicles, the monitoring device 130 may be moved between the vehicles on an as-needed basis.

Another embodiment of the monitoring device is illustrated in FIG. 7. In this embodiment, the plug-in electric vehicle 48 includes an in-vehicle computer system 124 having a display 142 located adjacent the drivers seat, such as in dashboard 144 for example. The in-vehicle computer system 124 provides operational functionality and a user interface for the driver. For example, the in-vehicle computer system 124 may provide operating information such as the amount of charge left in battery 58, the mode of propulsion (gasoline or battery), or the amount of miles left until more gasoline or a recharge will be required. The in-vehicle computer system may also provide other functionality such as a navigation system or an entertainment system for example. It may be desirable to provide the in-vehicle computer system access to the network 114, such as to provide traffic updates or the location of the nearest charging station for example.

In the embodiment shown in FIG. 7, the in-vehicle computer system 124 includes a wireless device 146, such as IEEE 802.11 (Wifi). The wireless device 146 is adapted to communicate with the monitoring device 60. The monitoring device 60 acts as a gateway to provide communications for the in-vehicle computer system 124 to the network 114. This provides an advantage to the operator since the operator will not need an additional service provider to gain access to the Internet. Further, since the monitoring device 60 includes a plurality of communications devices 94, 96, 98, 100, 102, 104, 106, the ability of the operator to obtain reliable and the cost effective communications may be achieved.

Figure 8:
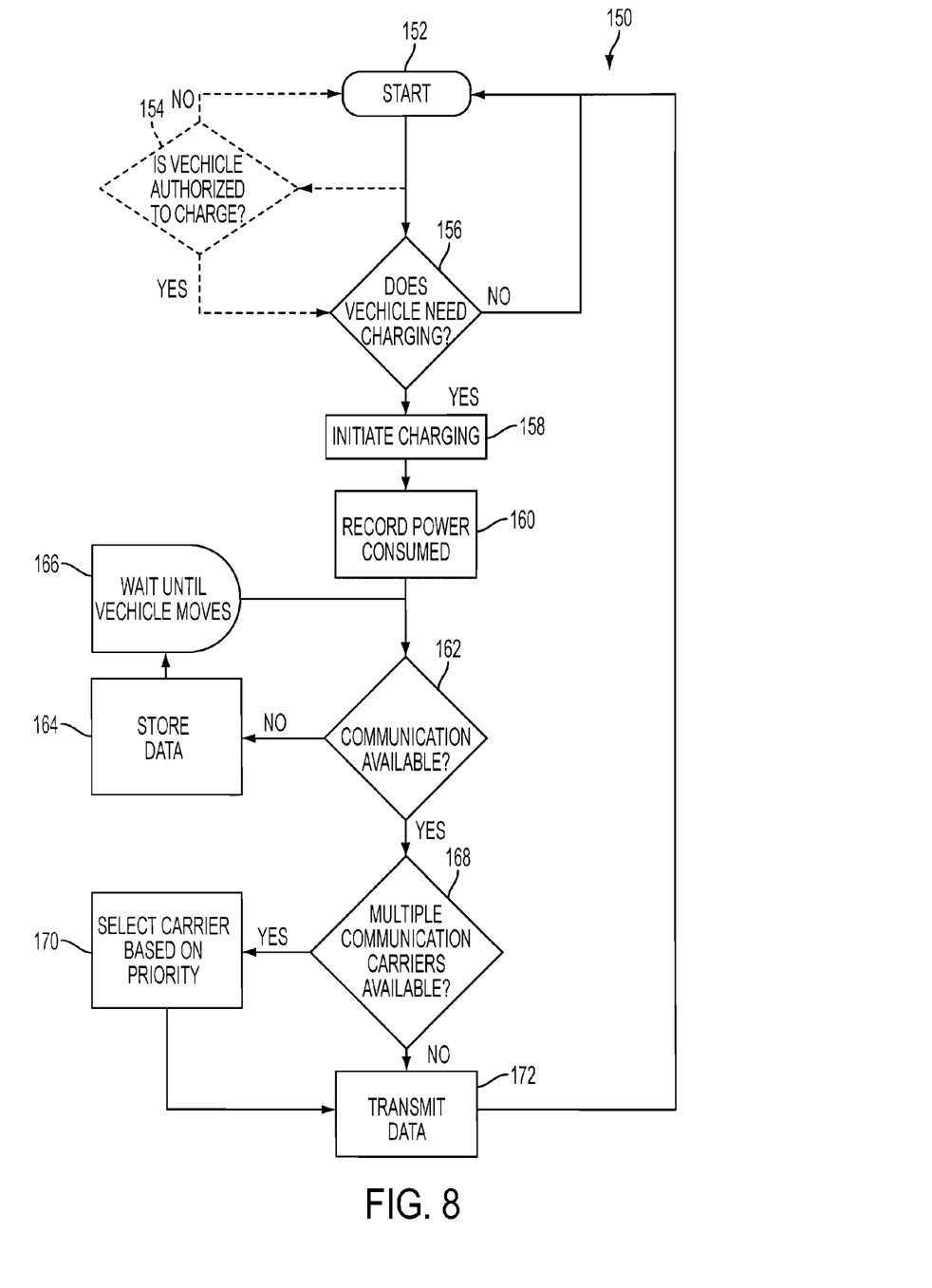

Referring now to FIG. 8, a method 150 for metering electrical consumption for an electric vehicle is shown. The method 150 starts in block 152. Where pre-authorization is required, an optional query block 154 determines whether the plug-in electric vehicle is authorized to charge. For example, the customer's account is current or the electrical outlet usage is not restricted to particular vehicles. The authorization for charging may be received via communications devices 94, 96, 98, 100, 102, 104, 106, for example. In one embodiment, the authorization may also be provided via components in the monitoring device 60, such as a radio-frequency identification ("RFID") circuit. In another embodiment, the communications circuit may have a unique media access control ("MAC") address that is communicated to a charging station. Finally, in another embodiment, the operator may enable authorization using an identification/account card. Such as by inserting an identification/account card into a kiosk for example. If query block 154 returns a negative, the method 150 loops back to start block 152 and the vehicle is not charged. If the query block 154 returns a positive, or if authorization is not required, then method 150 proceeds to block 156.

Query block 156 determines whether the vehicle needs to be charged. If query block 156 returns a negative, the method 150 loops back to the start block 152. If query block 156 returns a positive, the method 150 proceeds to block 158 where the flow of electricity is initiated to the plug-in electric vehicle. The method 150 then proceeds to block 160 where the consumption of electrical power by the plug-in electric vehicle is recorded. Once charging has been completed, either because the batteries are fully recharged, or because the operator interrupts the charging, the method 150 proceeds to query block 162.

With the electrical consumption recorded, the method 150 will attempt to communicate the consumption and/or authorization data to the utility or electrical provider. Query block 162 determines whether there are any communications carriers available for the transmission of the data. If the query block 162 returns a negative, such as if the operator is in a rural area, for example, the method 150 proceeds to block 164 where the data is stored. The method 150 waits in block 166 until the vehicle is moved before looping back to query block 162 to determine if any communications carriers are available. It should be appreciated that the block 166 may be based on time (e.g. periodically attempting transmission), or based on vehicle location such as by using a GPS device.

It should further be appreciated that once the data is stored in block 164, the method 150 may loop back to start block 152 if the operator once again couples the vehicle for charging. In this embodiment, the additional electrical consumption charging will be recorded as described above.

When the query block 162 determines that one or more communications carriers are available, the method 150 proceeds to query block 168 where it is determined if there are multiple carriers available. If query block 168 returns a positive, the method 150 proceeds to block 170 where the communications carrier is selected based on one or more predefined criteria. For example, the selection may be based on cost of communicating via the carrier, and the lower cost carrier would be selected. The criteria may also be based on other factors, such as the quality or strength of the carrier signal.

Once the communications carrier has been selected, or if the query block 168 returns a negative, the method 150 proceeds to block 172 where the data is transmitted to the utility or electrical service provider. The method 150 then loops back to start block 152 where the process begins again.

The use of plug-in electric vehicles is expected to reduce the overall amount of carbon emissions from the driving of personal vehicles since the emissions associated with generating electricity are lower than the cumulative emissions from fossil fuel based automobiles. One method of tracking emissions is called a "carbon credit." Under international treaties, such as the Kyoto Protocol, carbon emission quotas are imposed on countries to place a cap on emissions. Each nation in turn places quotas on industries within their country. A carbon credit is a tradable commodity that is created through "green" or low emission activities. Through the use of carbon credits, a high emission operator may offset their emissions by purchasing credits from the producers of the carbon credits. It should be appreciated that while the embodiments discussed herein have referred to accounts or "fund" transfers, these transfers may also be in the form of a carbon credit. Further, due to the increased electrical demand from plug-in electric vehicles, utilities may have increased emissions even though the over all combined emission levels are lower. It is contemplated that the utilities. Governmental entities, or third parties would be provided carbon credits or some other offset associated with providing of electrical power to plug-in electric vehicles.

It should be appreciated that a system of authorized utility accounts may be advantageous to governmental tax authorities as well. As the availability and proliferation of plug-in electric vehicles expands, the tax base of what is known as "road use taxes" will decrease as well. Road use taxes are generated from the sale of fuel, such as gasoline for example, and used by governmental authorities to build and maintain the system of roadways used by society. By using less fuel the plug-in electric vehicle owner will continue to use the roadways while paying less in taxes for that use. While this may be desirable to the individual, in the long term this could be detrimental for society. By maintaining the utility accounts that segregate electrical consumption by plug-in electric vehicle from that of the normal residential electrical loads. While a new road-use tax could be imposed on the electricity consumed by the end users, this could unfairly penalize those utility customers who own conventional combustion engine vehicles. These end users would end up paying for road taxes twice, once on their gasoline purchase and then again with their electricity consumption. By implementation of the utility accounts and the segregating plug-in electric consumption from the other residential loads, the governmental tax authority is provided with an appropriate means for collecting road use taxes without penalizing other residences that do not have a plug-in electric vehicle.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

The invention claimed is:

1. A mobile metering device for vehicles, comprising:
a current transformer;
a meter electrically coupled to said current transformer;
a controller electrically coupled to said meter, said controller having a memory device and a processor;
a plurality of communications devices electrically coupled to said controller and adapted to transmit data using a first or second wireless carrier; and
a housing configured to fit in a trunk of a vehicle, wherein the current transformer, the meter, the controller, and the plurality of communications devices are mounted within the housing;
wherein the processor is responsive to executable computer instructions that determine if the first and second wireless carriers are available and that select one of the first or second communications device in response to receiving a signal from the meter;
wherein the mobile metering device is configured to be moved from one vehicle to another.

2. The mobile metering device of claim 1, wherein said plurality of communications devices include a plurality of wireless communications devices and at least one device adapted to communicate using an OBD-II protocol.

3. The mobile metering device of claim 2, wherein said plurality of wireless communications devices includes a first communications device adapted to transmit and receive signals using a IEEE 802.11 protocol.

4. The mobile metering device of claim 3, wherein said first communications device is adapted to transmit and receive signals from a vehicle computer system.

5. The mobile metering device of claim 3, wherein said plurality of wireless communications devices includes a first communications device adapted to transmit in a frequency range of 3 to 40 GHz, a second communications device adapted to transmit in a frequency range of 30 KHz to 300 MHz, and a third communications device adapted to transmit in a frequency range of 30 to 300 MHz.

6. The mobile metering device of claim 1, further comprising a battery electrically coupled to said meter and said controller.

7. The mobile metering device of claim 1, wherein the mobile metering device can be transported by a single person.

8. A method of providing mobile metering of a vehicle, comprising:
providing a current transformer;
coupling a meter to said current transformer;
coupling a controller having a memory device and a processor to said meter;
coupling a plurality of communications devices to said controller, the communications devices adapted to transmit data using a first or second wireless carrier;

mounting the current transformer, the meter, the controller, and the plurality of communications devices within a housing configured to fit in a trunk of a vehicle;

using the processor to determine if the first and second wireless carriers are available; and using the processor to select one of the first or second communications device in response to receiving a signal from the meter;

wherein the mobile metering device is configured to be moved from one vehicle to another.

9. The method of claim 8, further comprising communicating using an OBD-II protocol with one of said plurality of communications devices.

10. The method of claim 9, further comprising communicating wirelessly with at least one of said plurality of communications devices.

11. The method of claim 10, further comprising transmitting and receiving signals with a vehicle computer system with one of said plurality of communications devices.

12. The method of claim 10, wherein said plurality of wireless communications devices includes a first communications device, a second communications device, and a third communications device.

13. The method of claim 12, further comprising:

transmitting in a frequency range of 3 to 40 GHz with said first communications device;

transmitting in a frequency range of 30 kHz to 300 MHz with a second communications device; and, transmitting in a frequency range of 30 to 300 MHz with a third communications device.

14. The method of claim 13, further comprising coupling a battery to said meter and said controller.

15. The mobile metering device of claim 14, wherein the mobile metering device can be transported by a single person.

16. A mobile metering device for a vehicle, comprising:

a connector;

a current transformer operably coupled to said connector;

a meter electrically coupled to said current transformer;

a plurality of communications devices adapted to transmit data using a first and second wireless carrier;

a controller electrically coupled to said meter and said plurality of communications devices, said controller having a memory device and a processor responsive to executable computer instructions to determine the availability of each of said plurality of communications devices to transmit data; and a housing configured to fit in a trunk of a vehicle, wherein the current transformer, the meter, the controller, and the plurality of communications devices are mounted within the housing;

wherein the mobile metering device is configured to be moved from one vehicle to another.

17. The device of claim 16, wherein said plurality of communications devices include at least one device complaint with IEEE 802.11 protocols, at least one device complaint with CDMA compliant cellular protocols, at least one device complaint with IEEE 802.15.4 protocols, and at least one device compliant with a Bluetooth protocol.

18. The device of claim 16, wherein at least one of said plurality of communications devices is a satellite communications device that transmits data on a frequency range of 3 to 40 gigahertz.

19. The device of claim 16, wherein the processor is further responsive to executable computer instructions that determine if the first and second wireless carriers are available and select one of the first or second communications device in response to receiving a signal from the meter.

20. The device of claim 16, wherein the processor is further responsive to executable computer instructions for selecting the first or second wireless carrier and transmitting a first signal indicating said electrical consumption data using the selected carrier.

21. The device of claim 16, wherein the processor is further responsive to executable computer instructions for determining if the first wireless carrier is available, negotiating a rate using the first wireless carrier, retrieving electrical consumption data from the memory device, and transmitting a second signal indicating the electrical consumption data.

22. The device of claim 16, the controller being further responsive to executable computer instructions for receiving an authorization code signal from a first external source and displaying the authorization code on a display and for receiving a transponder signal from a second external source and transmitting a second signal on a selected wireless carrier.

* * * * *